United States Patent [19]
Chen et al.

[11] Patent Number: 5,573,965
[45] Date of Patent: Nov. 12, 1996

[54] METHOD OF FABRICATING SEMICONDUCTOR DEVICES AND INTEGRATED CIRCUITS USING SIDEWALL SPACER TECHNOLOGY

[75] Inventors: Min-Liang Chen, Allentown; Sailesh Chittipeddi, Whitehall; Taeho Kook, Lower Macungie Township; Richard A. Powell, Lower Milford Township; Pradip K. Roy, Allentown, all of Pa.

[73] Assignee: Lucent Technologies Inc., Murray Hill, N.J.

[21] Appl. No.: 169,482

[22] Filed: Dec. 17, 1993

Related U.S. Application Data

[62] Division of Ser. No. 678,561, Mar. 27, 1991, abandoned.

[51] Int. Cl.[6] .......................... H01L 21/31; H01L 21/335
[52] U.S. Cl. .................. 437/41; 437/44; 437/239
[58] Field of Search ...................... 437/44, 41, 239, 437/43, 41 SW

[56] References Cited

U.S. PATENT DOCUMENTS

| | | | |
|---|---|---|---|
| 4,038,107 | 7/1977 | Marr et al. | 148/1.5 |
| 4,638,347 | 1/1987 | Iyer . | |
| 4,697,199 | 9/1987 | De Graaf et al. . | |
| 4,735,680 | 4/1988 | Yen | 156/643 |
| 4,764,477 | 8/1988 | Chang et al. | 437/29 |
| 4,818,714 | 4/1989 | Haskell | 437/44 |
| 4,843,023 | 6/1989 | Chiu et al. | 437/34 |
| 4,851,730 | 7/1989 | Doklan et al. | 437/225 |
| 4,853,352 | 8/1989 | Newkirk et al. . | |
| 4,981,810 | 1/1991 | Fazan et al. | 437/44 |
| 5,183,770 | 2/1993 | Ayukawa et al. | 437/41 |
| 5,221,632 | 6/1993 | Kurimoto et al. | 437/44 |
| 5,256,586 | 10/1993 | Choi et al. | 437/44 |

FOREIGN PATENT DOCUMENTS

| | | |
|---|---|---|
| 0315229 | 10/1989 | European Pat. Off. . |
| 0424019 | 4/1991 | European Pat. Off. . |
| 167791 | 9/1991 | Taiwan . |
| 173422 | 11/1991 | Taiwan . |

OTHER PUBLICATIONS

Wolf. S., Silicon Processing, vol. 2, 1990, Lattice Press, pp. 600–609, 628–631.
M. Orlowski et al., IEDM, "Submicron Short Channel Effects Due Gate Reoxidation Induced Lateral Interstitial Diffusion" pp. 632–635, 1987, Proceedings of the IEDM.
Parrillo, Louis C. et al, *IEEE Transactions on Electron Devices* 38 (1991) Jan. No. 1, pp. 39–46, "Disposable Polysilicon LDD Spacer Technology".
Roy, Pradip K. et al., *AT&T Technical Journal*, Nov./Dec. No. 6 (1988), pp. 155–174, "Synthesis of High–Quality Ultra–Thin Gate Oxides for ULSI Applications".
Wong, Catherine Y. et al, *IEEE Electron Device Letters*, Sep. 1989, No. 9, pp. 420–422, "Sidewall Oxidation of Polycrystalline–Silicon Gate".

*Primary Examiner*—T. N. Quach
*Attorney, Agent, or Firm*—Michael J. Urbano; John T. Rehberg

[57] ABSTRACT

The base layer of high quality spacers, such as those used on the sidewalls of the gate stack of submicron devices (e.g., MOSFETs, EPROMs), are formed as composite, multi-layered structures of silicon oxides or of silicon oxides and silicon nitride.

17 Claims, 4 Drawing Sheets

METHOD OF FABRICATING SEMICONDUCTOR DEVICES AND INTEGRATED CIRCUITS USING SIDEWALL SPACER TECHNOLOGY

This is a division of application Ser. No. 07/678,561 filed Mar. 27, 1991, abandoned.

BACKGROUND OF THE INVENTION

This invention relates to semiconductor devices and integrated circuits using sidewall spacer technology.

In order to reduce the electric field in the vicinity of the gate/drain edge of MOSFET devices, it is common to employ a LDD structure which positions a relatively lightly doped region under the gate and a more heavily doped region between the lightly doped region and the field oxide. The processing technology commonly used to realize such LDD structures follows the general prescription of U.S. Pat. No. 4,038,107 granted to G. Mart and G. E. Smith; that is, the principal steps include forming source and drain openings to allow one or more first ion implantation steps; reducing the size of the openings by forming (e.g., by oxidation) spacers on the sidewalls of the gate stack; and then by means of one or more second ion implantation steps, implanting additional impurities through the reduced size openings. The spacer serves to prevent any substantial implantation in the region thereunder, thus preserving the desired lightly-doped region.

Spacer technology has become very common in 1.25 μm and 0.8 μm technology where a quadrant-like spacer typically comprises a single L-shaped base layer adjacent both the gate stack and the substrate and also includes a filler layer disposed between the legs of the L-shaped base layer. For these design rules, use of a single layer grown oxide for the base layer and a deposited oxide for the filler layer has been found to be adequate for many applications. However, as design rules shrink to well below 1 μm (e.g., 0.5 μm or 0.35 μm), a number of problems arise or are exacerbated: (1) As the spacer gets very thin, the dielectric quality and the Si/SiO$_2$ interfacial substructure of the spacer material become more and more important. The quality problem is further complicated by the fact that the surface of the sidewalls on which the base layer is formed is typically a polysilicon surface, not a single crystal silicon surface; (2) A well-known micro bird's beak (e.g., feature 10 of FIG. 10) forms at the edges of the gate during the thermal oxidation step used to grow the base layer. The bird's beak itself reduces the localized electric field at the edges of the gate, which is beneficial. However, if the bird's beak is too large, the thickness of the gate oxide may become too nonuniform. Consequently, the threshold voltage characteristics of the FET may be degraded and the source/drain series resistance may increase. Therefore, it would be highly desirable to be able to tailor the bird's beak to different transistor designs so as to improve control over threshold voltage and series resistance; and (3) A significant portion of the spacer may be underdesirably etched away when the wafer is cleaned by wet chemical etching (e.g., before performing a salicide process), resulting in the possible exposure of underlying gate-level defects (GLDs; e.g., Si particles protruding from a polysilicon gate stack). In subsequent processing, a silicide may form on the exposed GLDs and cause device failure or performance degradation. Therefore, protecting the spacer from such etching degradation would be highly desirable.

SUMMARY OF THE INVENTION

In accordance with one aspect of the invention, the base layer of sidewall spacer of a semiconductor device or integrated circuit comprises a composite multi-layered dielectric, preferably a multi-layered oxide. In accordance with another aspect of the invention the multilayered dielectric base layer is fabricated by growing a first oxide layer, forming an oxygen-permeable dielectric layer on the first oxide layer, and growing a second oxide layer between the first layer and the sidewall by causing an oxidizing species to penetrate through the dielectric layer and the first layer.

In a preferred embodiment particularly useful in MOSFET technology, an etch-resistant cap layer is formed on the dielectric layer which itself is preferably a deposited oxide. The latter is densifted during the growth of the second oxide layer.

Depending on the particular submicron design rule employed, and upon the intended device application, the base layer may be L-shaped and a quadrant-like filler may or may not fill the space between the legs of the L-shaped base layer.

BRIEF DESCRIPTION OF THE DRAWINGS

The invention, together with its various features and advantages, can be readily understood from the following more detailed description taken in conjunction with accompanying drawing, in which.

In the interests of clarity of illustration, the figures have not been drawn to scale.

DETAILED DESCRIPTION

Figure 7:
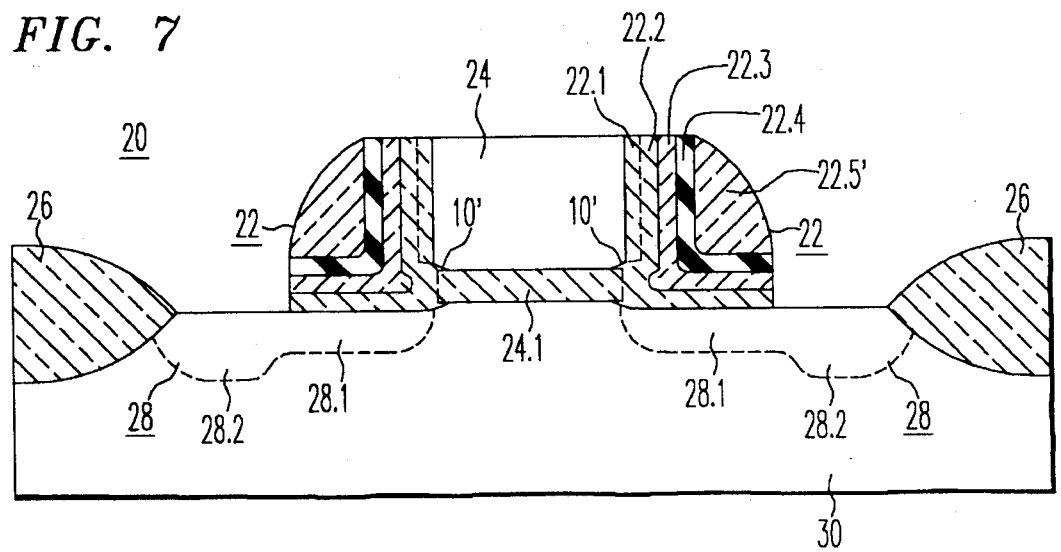

Turning now to FIG. 7, there is shown one embodiment of the invention, semiconductor device 20 which includes spacers 22 formed on the sidewalls of a structural feature 24. Each spacer 22 comprises a composite, multi-layered base layer (22.1-22.3), an optional etch resistant layer 22.4, and an optional filler region 22.5'. The base layer comprises first oxide layer 22.1 disposed at the sidewall of the feature, a second oxide layer 22.2 disposed adjacent layer 22.1, and an oxygen-permeable dielectric layer 22.3 disposed on layer 22.2. In an embodiment preferred for some applications, an etch-resistant cap layer 22.4 is disposed on the dielectric layer 22.3. Depending on the design rules and intended device application, the spacer may include optional, quadrant-like oxide filler region 22.5, which is disposed between the legs of the L-shaped layer 22.4.

Illustratively, device 20 is a MOSFET in which the structural feature 24 is a gate stack, including gate dielectric 24.1, disposed between field oxide (FOX) regions 26. Source and drain regions 28 are located in substrate 30 between the gate stack and the FOX regions 26. The term "substrate" is intended to include a single crystal semiconductor body or such a body with one or more layers formed thereon; e.g., an epitaxial layer or a polycrystalline layer. Omitted for simplicity are the well-known metallization and/or silicide regions typically used to make electrical contact to the source, drain and gate.

In a preferred embodiment of silicon MOSFETs, substrate 30 is single crystal silicon, gate stack 24 comprises polysilicon, gate dielectric 24.1 comprises a silicon oxide, first and second oxide layers 22.1 and 22.2 are thermally grown silicon oxides, oxygen-permeable layer 22.3 comprises TEOS (i.e., a silicon oxide layer formed by CVD from a tetraethylorthosilicate source), etch-resistant layer 22.4 comprises an etch resistant material such as silicon nitride, and oxide filler region 22.5' also comprises TEOS. The term TEOS includes variations and equivalents thereof such as, for example, BPTEOS (boron and phorphous doped TEOS). In a further preferred embodiment, the grown oxide layers 22.1 and 22.2 and the deposited oxide layer 22.3 are low defect density oxides fabricated by a grow-deposit-grow process of the type described in U.S. Pat. No. 4,851,370 granted on Jul. 25, 1989 to R. H. Doklan, E. P. Martin, P. K. Roy, S. F. Shive and A. K. Sinha.

Although the following specification describes composite, multi-layered spacers for use in LDD (lightly-doped drain) MOSFET devices, the invention is also suitable for other applications in which, for example, spacers are used to provide dielectric isolation. The latter includes isolation of the gate from source/drain in salicided MOSFETs (FIGS. 8–9) and the isolation of conductive polycrystalline or amorphous silicon levels in EPROMs.

Figure 1:
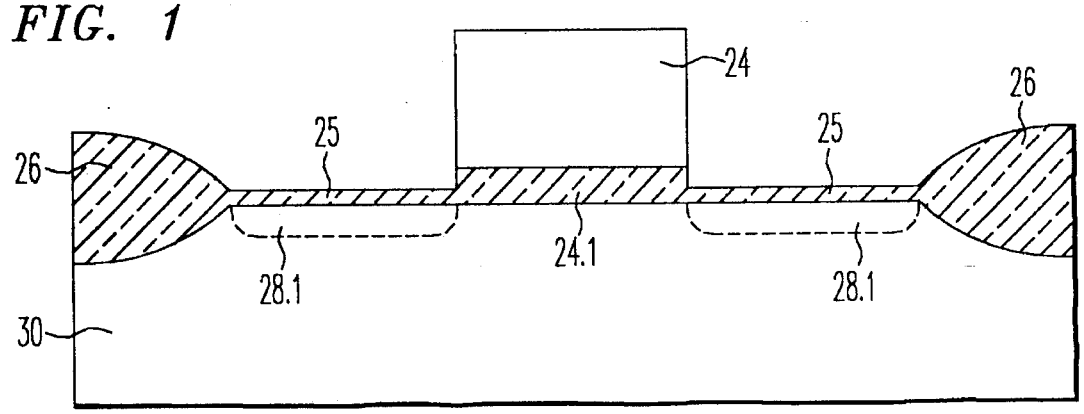
FIGS. 1 through 7 are cross-sectional views of an LDD MOSFET at sequential stages in its fabrication in accordance with one embodiment of the invention.
Figure 2:
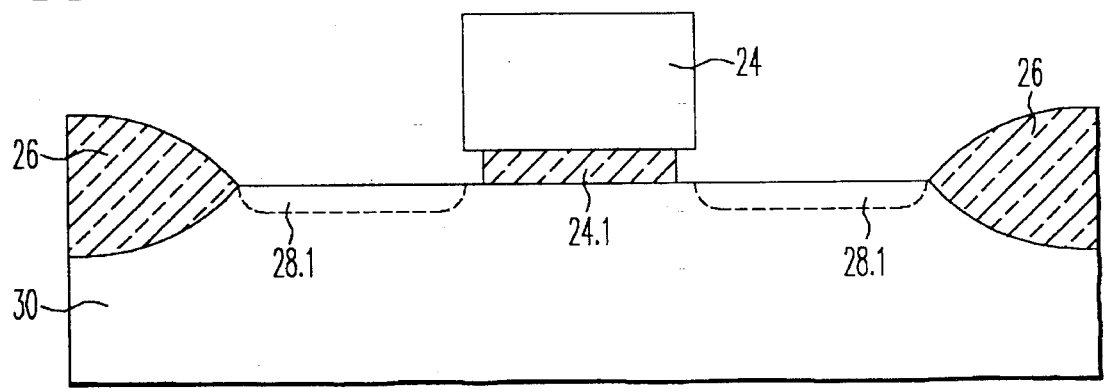

More specifically, fabrication of a LDD MOSFET at, for example, 0.5 μm design rules or less in accordance with the above embodiment of the invention begins with a suitable single crystal silicon substrate 30 as shown in FIG. 1. Using techniques well-known in the art, a polysilicon gate stack 24 is formed between FOX regions 26. Gate oxide layer 24.1 separates gate stack 24 from substrate 30. Oxide layers 25 also cover the location where the spacers and source/drain regions will later be formed. Oxide layers 25 are removed and gate stack 24 is slightly undercut, as shown in FIG. 2, by a wet chemical etch using illustratively 100:1 HF in water.

Before removing oxide layers 25 shown in FIG. 1, however, suitable n-type impurities (e.g., P or As at a dose of about 2 E13–6 E13) for an n-channel device or suitable p-type impurities (e.g., B from a $BF_2$ source at a dose of about 5 E13–8 E14) for a p-channel device are implanted through layer 25 into the underlying top surface of substrate 30. Subsequent heating, which takes place during a subsequent grow-deposit-grow process, drives in the impurities so as to form relatively shallow, lowly doped regions 28.1.

Figure 3:
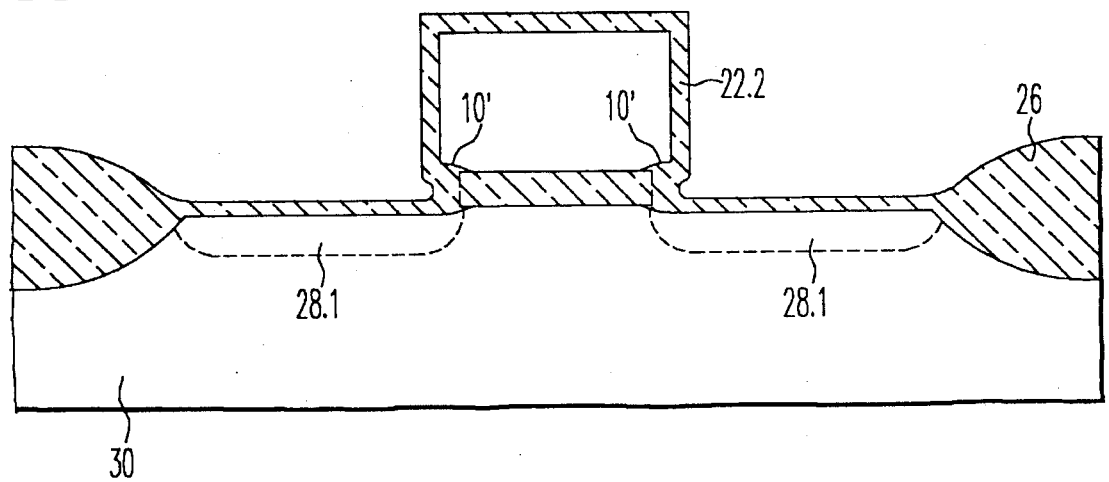
Figure 4:
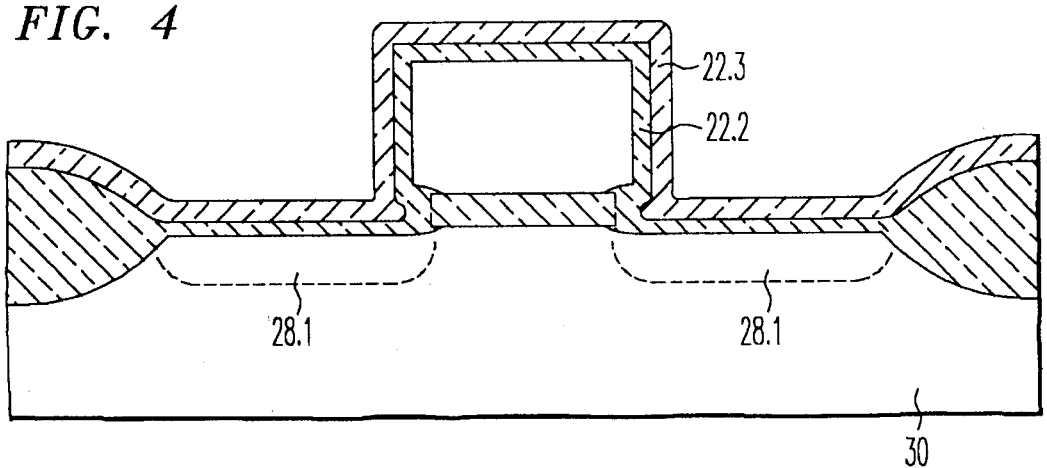
Figure 5:
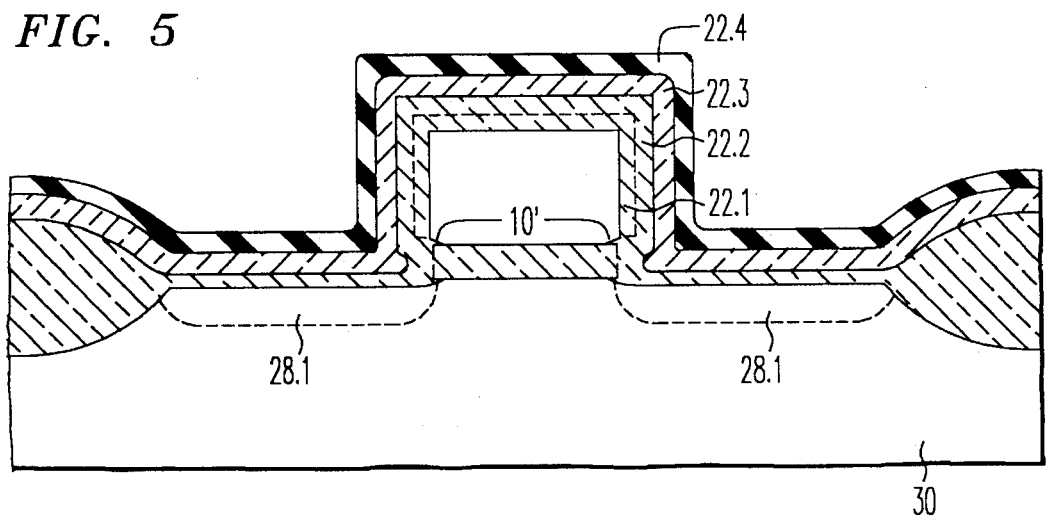

The first step in the grow-deposit-grow process to form the composite, multi-layered base layer is the thermal growth of oxide layer 22.2, as shown in FIG. 3, in an oxygen ambient at a temperature of about 700°–900° C. Growth of about 30Å–150Å of oxide layer 22.2 is adequate. As shown in FIG. 4, the second step is to deposit an oxygen-permeable TEOS layer 22.3, e.g., about 30Å–150Å thick, by the well-known CVD from a tetraethylorthosilicate source (e.g., at about 0.2–0.3 tort and about 600°–630° C.). Other oxygen permeable insulators, such as silicon oxynitride, may be used for layer 22.3. As shown in FIG. 5 the third step is to thermally grow oxide layer 22.1 (e.g., about 30Å–100Å thick ) between polysilicon stack 24 and first oxide layer 22.2. This growth is accomplished by atmospheric or high pressure (e.g., about 5–10 atm) thermal oxidation at an elevated temperature (e.g., at about 700°–900° C.; higher temperatures can be used for rapid thermal oxidation processes). As taught in U.S. Pat. No. 4,851,370, oxygen penetrates through both the TEOS layer 22.3 and the oxide layer 22.2 to grow oxide layer 22.1. This growth step also densities deposited TEOS layer 22.3. The grown and deposited oxide layers have defect structures that are misaligned with respect to each other and form an interface which acts as both a stress sink and a defect trap. In addition, the grown oxide 22.1 is of high dielectric quality (e.g., in terms of leakage current, breakdown strength, and charge-to-breakdown) and forms an interface with polysilicon gate stack that is relatively stress and aspirite free.

Figure 10:
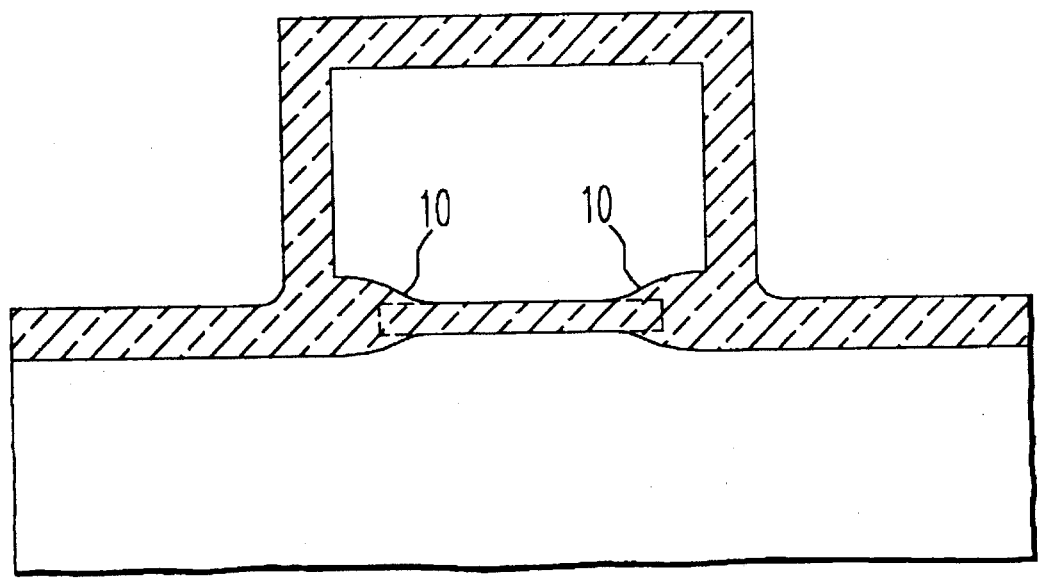
FIG. 10 is a schematic cross-sectional view of a prior art semiconductor device illustrating micro bird's beaks 10 formed at edges of a gate stack.

The thicknesses of the thermal oxide layers 22.1 and 22.2, as well as the densification conditions, can be readily tailored to adjust the size of the bird's beak 10, shown in FIG. 5. That is, the size of the bird's beak is related to the time it takes to grow layers 22.1 and 22.2. Because this aspect of the invention utilizes much thinner thermal oxides than the prior an (oxide layer 11 of FIG. 10), thermal oxidation of the gate stack 24 and of substrate 30 penetrates less in the region of the undercut (hence the bird's beak is smaller).

The thinner thermal oxides realized by the inventive process give rise to several other advantages: (1) the lateral diffusion of the source/drain implant under the gate edge is reduced, and (2) the reverse short channel effect (which is related to diffusion of the channel implant under the gate) is also reduced. With respect to the latter, see M. Orlowski et al, *Proceedings of IEDM,* pages 632–635 (1987).

After the formation of the composite oxide base layer 22.1, 22.2, 22.3 described above, an optional etch resistant layer 22.4, as shown in FIG. 5, may be deposited on TEOS layer 22.3 by techniques well known in the art. Illustratively, layer 22.4 comprises wet-etch resistant material such as about 200- 600A of silicon nitride. Where GLDs are a problem, layer 22.4 protects the base layer structure from being attacked by subsequent wet chemical etchants (e.g., those such as HF used in cleaning steps) and hence reduces the likelihood that GLDs will be exposed. Keeping GLDs unexposed is important, especially where a silicide process or a salicide process is used to form contacts, because silicides tend to form on GLDs (typically silicon particles) but not on silicon nitrides. Thus, the incidence of silicide shorts is expected to be greatly reduced. In addition, the nitride layer caps the base layer structure and prevents any substantial further oxidation of the polysilicon gate stack and hence any further growth of the bird's beaks 10'.

Figure 6:
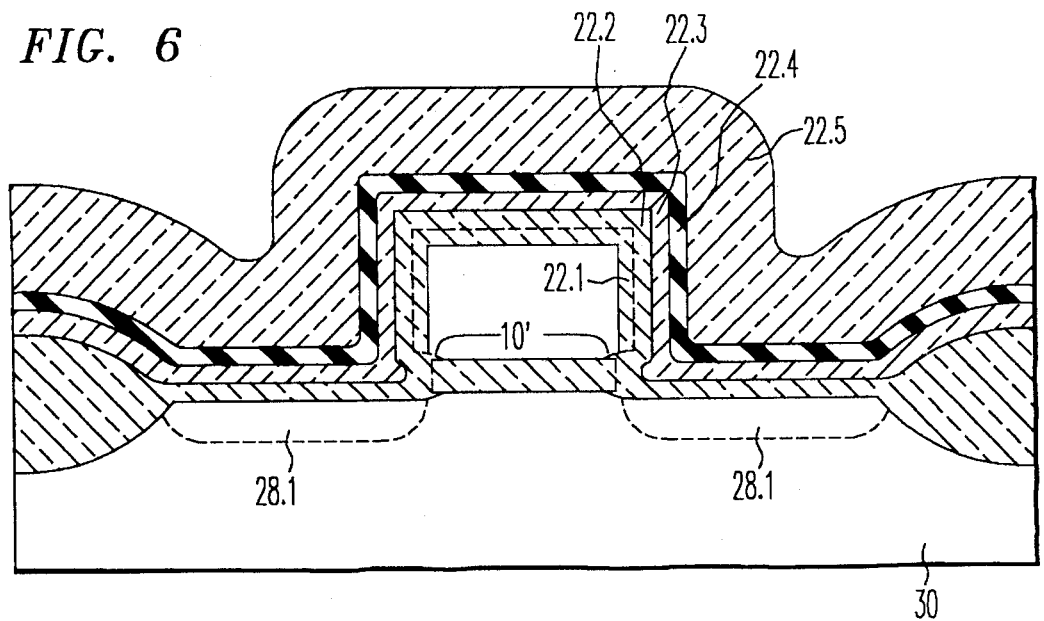

Whether or not the nitride layer 22.4 is used, an optional conformal dielectric layer 22.5 (e.g., about 1500Å–2000Å of densifted TEOS) may be formed over the wafer, as shown in FIG. 6. The wafer is then anisotropically etched, as shown in FIG. 7, using well-known plasma etching techniques to remove all of layers 22.2, 22.3, 22.4 and 22.5 except the portions thereof which define spacers 22 adjacent gate stack 24. Quadrant-like filler region 22.5' results from this etching process.

After the spacers are formed, a relatively high energy impurity implant and drive in forms the more highly doped regions 28.2 of the LDD MOSFET, as shown in FIG. 7. Illustratively, for n-channel devices this implant uses As ions at a dose of about 2-8 E15, whereas for p-channel devices this implant uses B from a $BF_2$ source at a dose of about a 2-8 E15. Note, more heavily doped regions 28.2 are shown to be deeper than lightly doped regions 28.1, but in some devices the converse may be true.

Contacts (not shown) are formed to the gate, source and drain using metalization techniques well known in the art.

Figure 8:
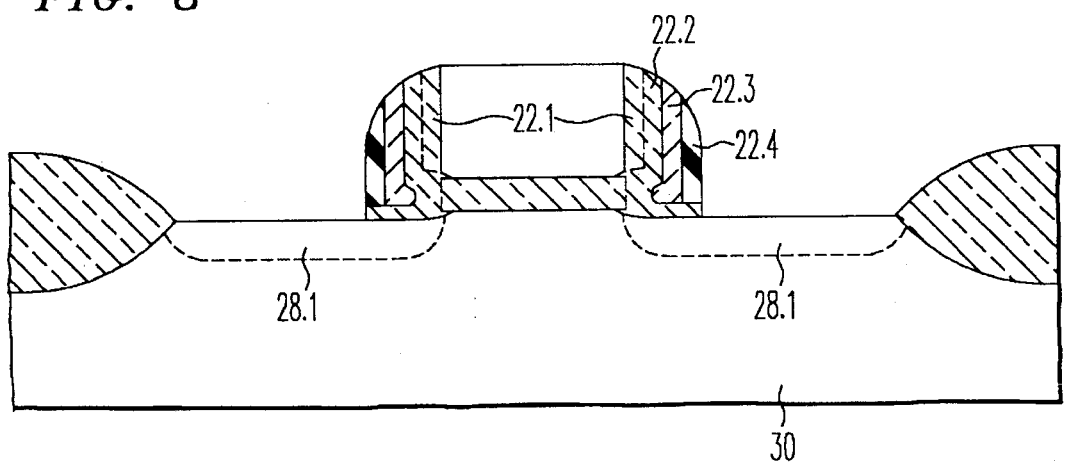
FIGS. 8 and 9 are cross sectional views of a salicided MOSFET in accordance with an alternative embodiment of the invention.
Figure 9:
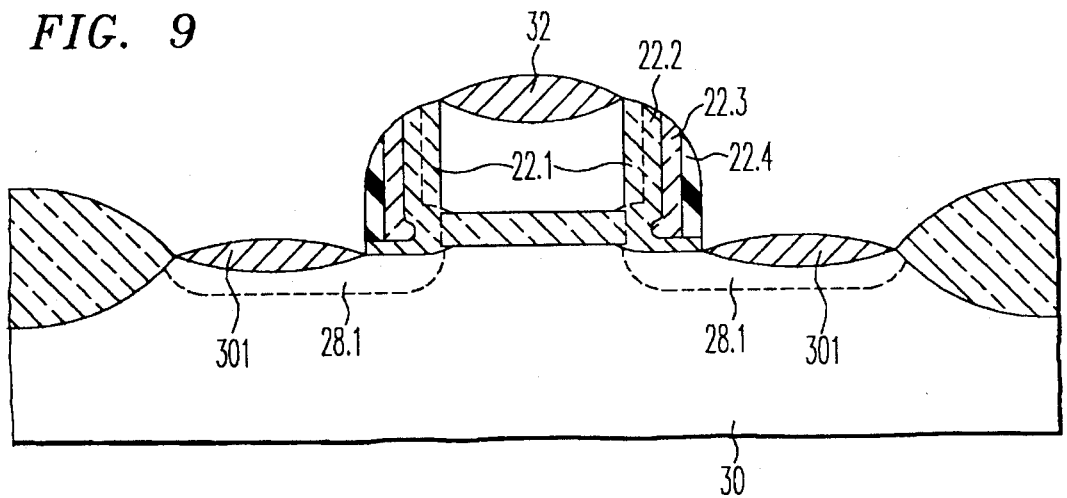

In those applications where use of conformal dielectric layer 22.5 of FIG. 6 is undesirable or not feasible, the thickness of dielectric layer 22.3 may be adjusted to give the base layer the desired (e.g., increased) thickness. In this case, the base layer itself forms the entire spacer since the filler region is not used. FIG. 8 illustrates this approach where the composite spacer shown would result from anisotropically etching a structure of the type depicted in FIG. 5. A subsequent silicide or salicide process well-known in the art would produce silicide source/drain contacts 301 and silicide gate contact 32, but no silicide would form on nitride portions 22.4, thus isolating these contacts from one another.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the embodiments of the invention using a nitride cap are applicable to a "merged window" contact design in which a single window exposes both the end of a gate runner of one transistor and a portion of the drain of another transistor. In this case, the nitride protects the underlying layers of the exposed spacer at the end of the runner from attack during the window-opening etch. Protecting the spacer in turn, prevents the contact metallization from directly contacting the shallow, lightly doped region.

We claim:

1. A method of fabricating an integrated circuit comprising forming a gate stack, including a gate dielectric, on a single crystal silicon substrate, said stack having sidewalls comprising silicon, and forming a spacer having a base layer adjacent at least one of said sidewalls, characterized in that said base layer forming step includes the steps of:

thermally growing a first oxide layer on said sidewall, depositing an oxygen-permeable dielectric layer on said first oxide layer, and thermally growing a second oxide layer between said gate stack and said first oxide layer by exposing said layers to an oxygen ambient at a pressure and temperature sufficient to cause oxygen to penetrate through said dielectric layer and said first oxide layer.

2. The method of claim 1 wherein said dielectric layer is deposited by a CVD deposition of TEOS and said second oxide layer is grown at a temperature sufficient to densify said dielectric layer.

3. The method of claim 2 wherein said thermal growth steps tend to form a bird's beak structure at the edges of said gate dielectric, and wherein the thicknesses of said first and second oxide layers are mutually adapted so as to control the size of said bird's beak structure.

4. The method of claims 1, 2 or 3 wherein said spacer forming step further includes the step of forming a wet-etch-resistant cap layer on said second oxide layer.

5. The method of claim 4 wherein said cap layer comprises silicon nitride.

6. The method of claim 4 wherein said spacer forming step further includes the steps of depositing a conformal oxide layer over said cap layer and anisotropically etching said layers so as to form a quadrant-like spacer.

7. The method of claim 6 further including (1) prior to growing said first oxide layer, the additional steps of (a) forming spaced apart field oxide regions on either side of said stack, (b) ion implanting impurities into said substrate to form relatively lightly doped regions between said stack and said field oxide regions, and (2) after forming said spacers, the additional steps of (a) ion implanting impurities into said substrate to form more heavily doped source/drain regions between said spacers and said field oxide regions, and (b) forming electrical contacts to said gate stack and to said source/drain regions.

8. The method of claim 4 wherein said spacer forming step further includes anisotropically etching said layers so as to form a quadrant-like spacer and to remove said layers over said stack and over regions in which a source and drain are to be formed.

9. The method of claim 8 further including forming a silicide layer on said stack and on said regions.

10. The method of claim 1 wherein said second oxide layer is grown under conditions effective to densify said dielectric layer.

11. The method of claim 1 wherein said sidewall comprises polysilicon.

12. A method of fabricating an integrated circuit with a design rule of about 0.5 μm or less, comprising forming a gate stack, including a gate dielectric, on a single crystal silicon substrate, said stack having sidewalls comprising polysilicon, and forming a spacer having a base layer adjacent at least one of said sidewalls, characterized in that said base layer forming step includes the steps of:

thermally growing a first oxide layer on said sidewall, depositing an oxygen-permeable dielectric layer on said first oxide layer, and thermally growing a second oxide layer between said gate stack and said first oxide layer by exposing said layers to an oxygen ambient at a pressure and temperature sufficient to cause oxygen to penetrate through said dielectric layer and said first oxide layer and sufficient to densify said dielectric layer.

13. The method of claim 12 wherein said dielectric layer is deposited by a CVD deposition of TEOS.

14. The method of claim 13 wherein said thermal growth steps tend to form a bird's beak structure at the edges of said gate dielectric, and wherein the thicknesses of said first and second oxide layers are mutually adapted so as to control the size of said bird's beak structure.

15. The method of claims 12, 13 or 14 wherein said spacer forming step further includes the step of forming a wet-etch-resistant cap layer on said second oxide layer.

16. The method of claim 15 wherein said cap layer comprises silicon nitride.

17. The method of claim 12 wherein said first oxide layer and said dielectric layer are each grown to a thickness in the range of approximately 30Å–150Å and said second oxide layer is grown to a thickness of approximately 30Å–100Å.

* * * * *